United States Patent
Roy et al.

(10) Patent No.: US 12,075,178 B2
(45) Date of Patent: Aug. 27, 2024

(54) IMAGE SENSOR

(71) Applicant: STMicroelectronics (Crolles 2) SAS, Crolles (FR)

(72) Inventors: Francois Roy, Seyssins (FR); Thomas Dalleau, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 106 days.

(21) Appl. No.: 17/986,505

(22) Filed: Nov. 14, 2022

(65) Prior Publication Data

US 2023/0164459 A1 May 25, 2023

(30) Foreign Application Priority Data

Nov. 25, 2021 (FR) ........................................ 2112477

(51) Int. Cl.
*H04N 25/77* (2023.01)
*H04N 25/75* (2023.01)

(52) U.S. Cl.
CPC ............. *H04N 25/77* (2023.01); *H04N 25/75* (2023.01)

(58) Field of Classification Search
CPC ........ H04N 25/75; H04N 25/76; H04N 25/77; H01L 27/14609; H01L 27/146; H01L 27/14643
See application file for complete search history.

(56) References Cited

U.S. PATENT DOCUMENTS

| | | | |
|---|---|---|---|
| 2009/0224351 A1* | 9/2009 | Hsieh | H04N 3/1568 257/444 |
| 2015/0229859 A1* | 8/2015 | Guidash | H04N 25/76 348/308 |
| 2016/0079291 A1 | 3/2016 | Moeneclaey et al. | |
| 2016/0150169 A1* | 5/2016 | Hynecek | H01L 27/14603 257/233 |
| 2019/0051685 A1 | 2/2019 | Handa et al. | |

FOREIGN PATENT DOCUMENTS

WO 2015141161 A1 9/2015

OTHER PUBLICATIONS

INPI Search Report and Written Opinion for priority application, FR 2112477, report dated Jul. 4, 2022, 9 pgs.

* cited by examiner

*Primary Examiner* — Kelly L Jerabek

(74) *Attorney, Agent, or Firm* — Crowe & Dunlevy LLC

(57) ABSTRACT

An image sensor includes a pixel array where each pixel is formed in a portion of a substrate electrically insulated from other portions of the substrate. Each pixel includes a photodetector; a transfer transistor; and a readout circuit comprising one or a plurality of transistors. The transistors of the readout circuit are formed inside and on top of at least one well of the portion. The reading from the photodetector of a pixel of a current row uses at least one transistor of the readout circuit of a pixel of at least one previous row, the well of the pixel of the previous row being biased with a first voltage greater than a second bias voltage of the well of the pixel of the current row.

16 Claims, 6 Drawing Sheets

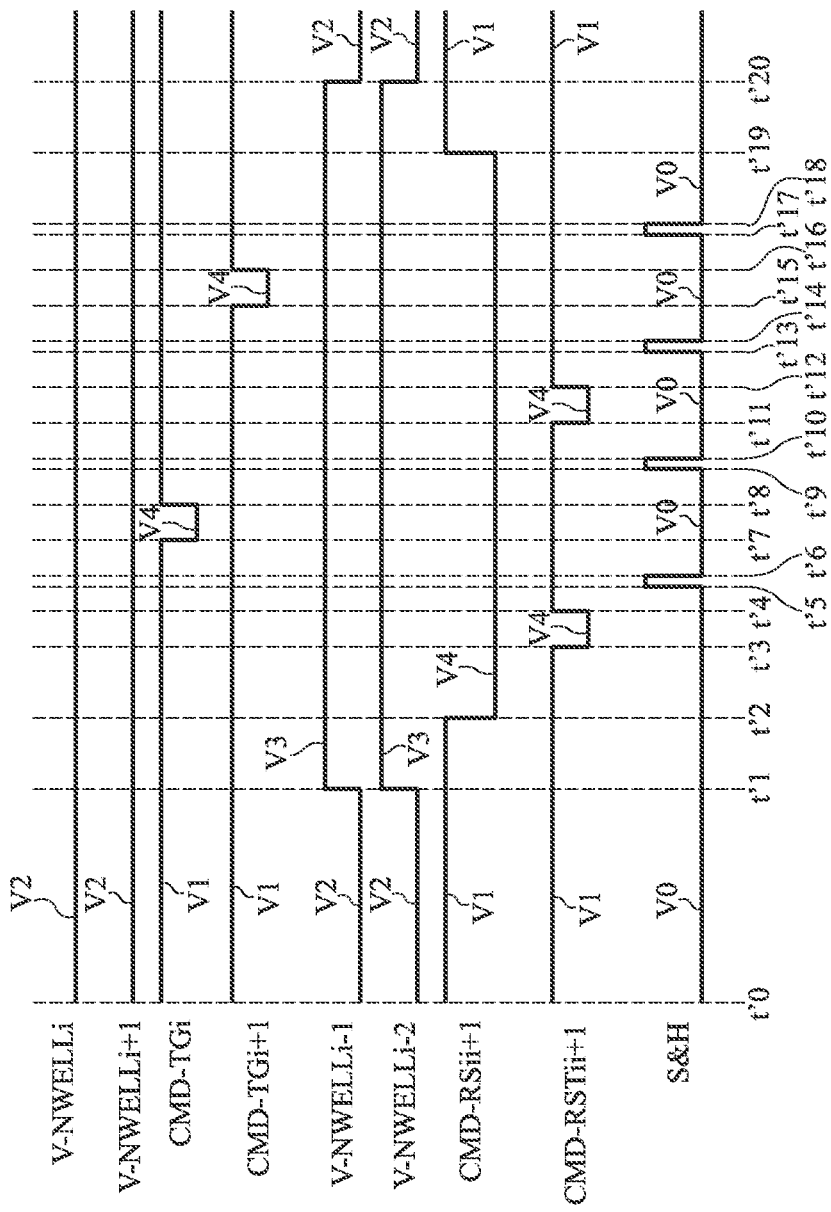

IMAGE SENSOR

PRIORITY CLAIM

This application claims the priority benefit of French Application for Patent No. 2112477, filed on Nov. 25, 2021, the content of which is hereby incorporated by reference in its entirety to the maximum extent allowable by law.

TECHNICAL FIELD

The present disclosure generally concerns electronic systems and devices and, more particularly, image sensors. The present disclosure more precisely concerns image sensors comprising pixel arrays.

BACKGROUND

An image sensor is a photosensitive electronic circuit or component used to convert an electromagnetic radiation, for example, a visible, ultraviolet or infrared radiation, into an electric signal.

Nowadays, image sensors may comprise one or a plurality of pixel arrays, each pixel comprising a photodetector adapted to converting the light that it absorbs into a measurable quantity, for example, an electric current or voltage. This or these arrays are generally accompanied by different control, readout, power supply, etc. circuits.

It would be desirable to at least partly improve certain aspects of known image sensors.

There is a need for image sensors consuming less power.
There is a need in the art to overcomes all or part of the disadvantages of known image sensors.
There is a need in the art to overcome all or part of the disadvantages of known methods for reading from photodetectors of an image sensor.

SUMMARY

An embodiment provides a method of reading from an image sensor comprising a pixel array where each pixel is formed in a portion of a substrate electrically insulated from other portions of the substrate. Each pixel comprises: a photodetector; a transfer transistor; and a readout circuit comprising one or a plurality of transistors, said transistor(s) of the readout circuit being formed inside and on top of at least one well of said portion. The method of reading from the photodetector of a pixel of a current row uses at least one transistor of the readout circuit of a pixel of at least one previous row, the well of the pixel of the previous row being biased with a first voltage greater than a second bias voltage of the well of the pixel of the current row.

According to an embodiment, the difference between said first and second voltages is in the range from 0.25 to 1 V.

According to an embodiment, the reading from the photodetector of the pixel of the previous row is performed before the reading from the photodetector of the current row.

According to an embodiment, the image sensor comprises a first circuit configured to bias the wells of the pixels of the array row by row.

According to an embodiment, the first circuit comprises a shift register.

According to an embodiment, said transistor(s) of the readout circuit are a P-channel MOS transistor.

According to an embodiment, the substrate is P-type doped, and the well is N-type doped.

According to an embodiment, the reading from the photodetector of a pixel of a row of rank i uses at least one first transistor of a readout circuit of a pixel of a row of rank i−1, and at least one second transistor of a readout circuit of a pixel of a row of rank i−2, the well of the pixel of the row of rank i−2 being biased with a third voltage greater than the second bias voltage of the well of the pixel of the row of rank i.

According to an embodiment, the readout circuit of a pixel comprises a reset transistor, a sense transistor, and a selection transistor.

According to an embodiment, said first transistor is the reset transistor, and said at least one second transistor comprises the transistor assembled as a voltage follower, and/or the row selection transistor.

According to an embodiment, the third voltage is equal to the first voltage.

An embodiment provides an image sensor adapted to implementing the previously-described readout method.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 7 shows timing diagrams illustrating an implementation mode of a method of reading the pixels of the image sensor of FIG. 6.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Various embodiments and variants have been described. Those skilled in the art will understand that certain features of these various embodiments and variants may be combined, and other variants will occur to those skilled in the art.

Figure 1:
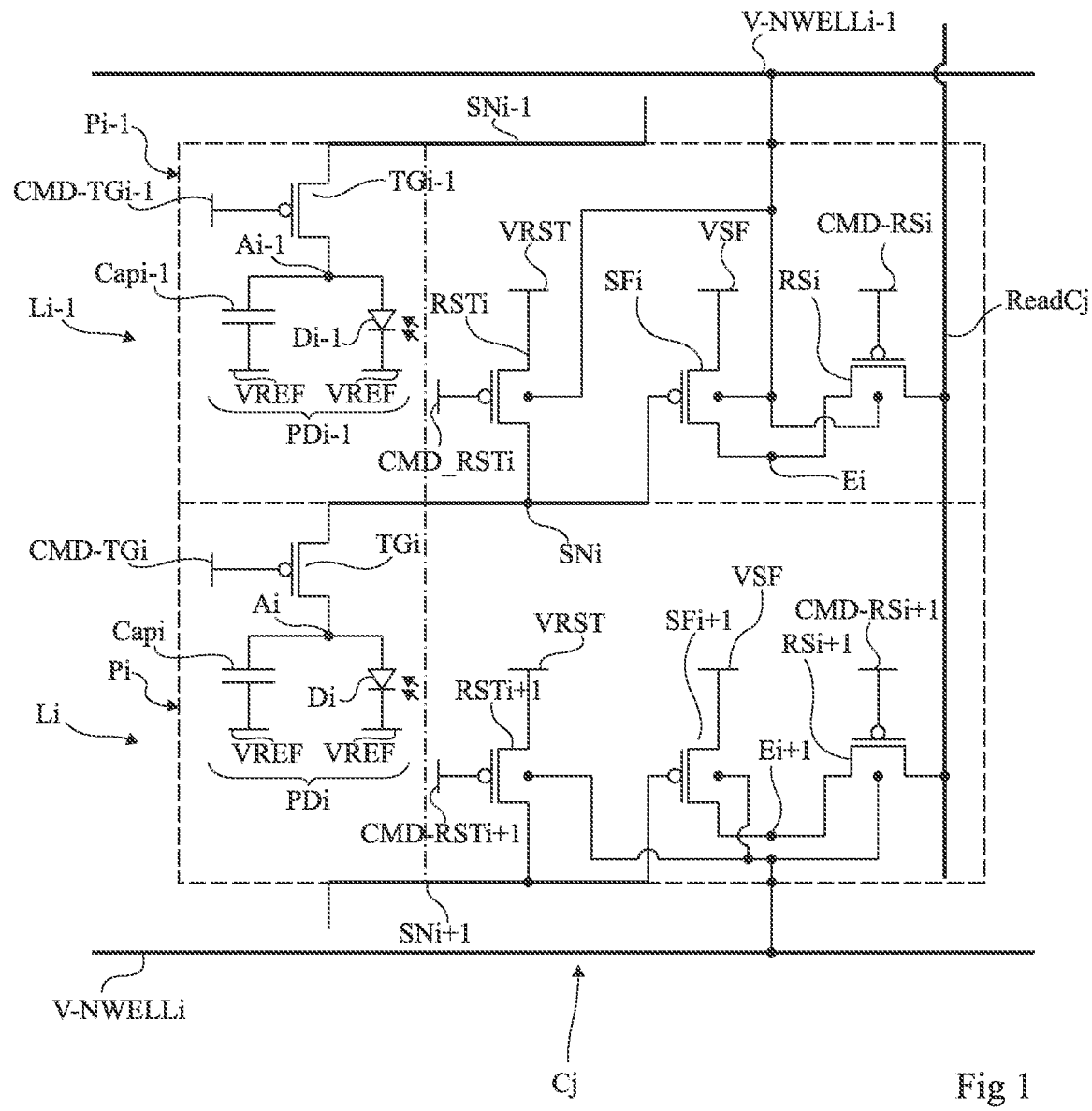
FIG. 1 shows an equivalent electric diagram of pixels of an embodiment of an image sensor.

FIG. 1 shows an equivalent electric diagram of pixels of an embodiment of an image sensor.

Figure 2:
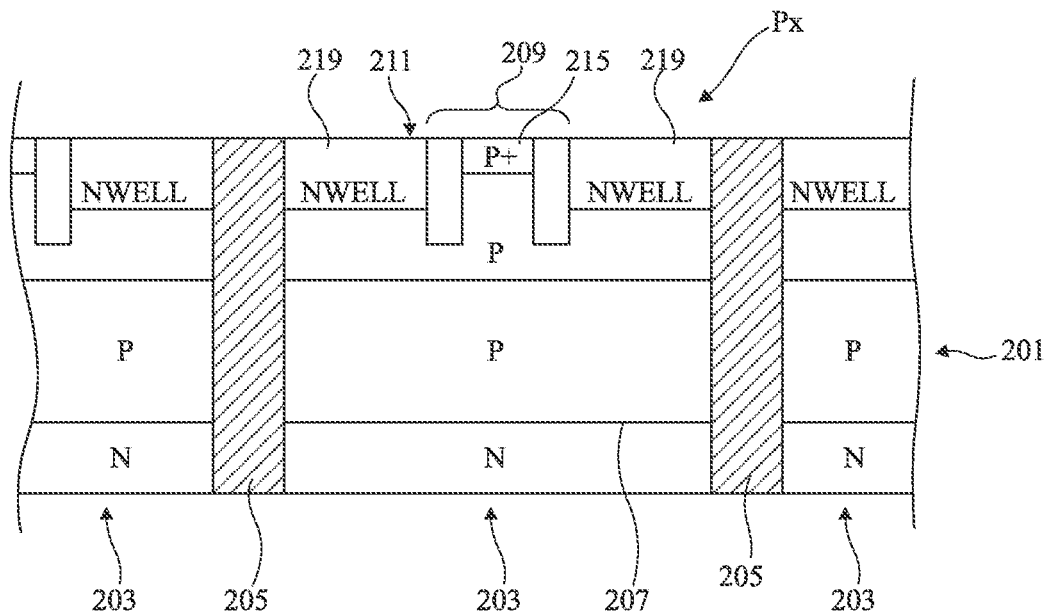
FIG. 2 schematically shows a cross-section view of a pixel of the image sensor of FIG. 1.

The sensor comprises an array layout of identical pixels, organized in rows and in columns. FIG. 2 only shows, for simplification, two pixels Pi−1 and Pi of consecutive rows Li−1 and Li of a same column Cj, i varying from 1 to n, where n is the number of rows in the array, j varying from 1 to m, where m is the number of columns in the array.

In the example of FIG. 1, the pixels of the pixel array have a 4T-type pixel architecture, that is, each pixel Px comprises a photodetector or photodiode PD and four transistors TG, RST, SF, and RS. Structurally, each pixel may be divided into a photosite and a readout circuit, contained in a same portion of a semiconductor substrate, electrically insulated from the portions where the other pixels are formed. The photosite comprises photodiode PD and a transistor TG for transferring charges to the readout circuit, generally called transfer gate. The readout circuit comprises three MOS transistors RST, SF, and RS, and is formed in a doped, for example, N-type doped, well formed in the substrate portion. An example of a pixel structure will be described hereafter in relation with FIG. 2. The transfer transistors TG of a same row Li have their gates interconnected and the transistors of same nature of the readout circuits are interconnected in a column.

By convention, reference will be made hereafter to a pixel of rank i,j as being a pixel having its photosite contained in the row of rank i and in the column of rank j. In other words, a pixel of rank i,j is the pixel having its photosite at the intersection of row i and of column j.

In the embodiments targeted by the present disclosure, the reading from a photosite of a pixel Pi,j, that is, of a row Li and of a column Cj, is performed by the readout circuit formed in an N-type doped well of a pixel of at least one previous row Li−1 of the same column Cj or of another column, for example, column Cj+1 or column Cj−1.

The photosite of pixel Pi comprises a photodetector PDi and a transfer transistor TGi. In practice, photodetector PDi is a photodiode symbolized in FIG. 1 by a diode Di in parallel with a capacitor Capi representing the inner capacitance of photodiode Di. Photodiode Di comprises an anode coupled, preferably connected, with an electrode of capacitor Capi, at a node Ai, and a cathode coupled, preferably connected, with the other electrode of capacitor Capi, at a node VREF at a reference potential. Node Ai is connected to the source of transistor TGi, the drain of the transistor TGi representing a sense node SNi of pixel Pi. The gate of the transfer transistor TGi is configured to receive a signal CMD-TGi of load switching from photodiode PDi to sense node SNi, or row selection signal CMD-TGi.

As previously mentioned, the photosite of pixel Pi is read from by the readout circuit formed in the N-type doped well, noted NWELLi−1 hereafter, of the substrate portion having the photosite of the pixel Pi−1 of the row of previous rank and, preferably, of the same column j, formed therein.

The readout circuit of pixel Pi−1, associated with the photosite of pixel Pi, comprises a sense transistor SFi, assembled as a source follower, having its gate connected to the sense node SNi of pixel Pi, having its drain coupled, preferably connected, to a node of application of a bias potential VSF (for example, 0 V), and having its source Ei coupled, preferably connected, to the source of a row selection (or read) transistor RSi. The gate of selection transistor RSi is configured to receive a signal CMD-RSi for selecting row i. The drain of transistor RSi is coupled, preferably connected, to an output node ReadCj, common to the pixels of column j. The readout circuit of pixel Pi−1 further comprises a reset transistor RSTi, having its source coupled, preferably connected, to the sense node SNi of pixel Pi, having its drain coupled to a node of application of a reset potential VRST, and having its gate configured to receive a control signal CMD_RSTi for resetting the pixels of row i. Thus, all the transistors of the readout circuit associated with the photosite of pixel Pi are formed in the well NWELLi−1 of pixel Pi−1.

Transistors TG, RST, SF, RS all are field-effect transistors, and more particularly MOS-type (Metal Oxide Semiconductor) transistors, for example, P-channel MOS transistors, or PMOS transistors.

According to the described embodiments, the bias voltages of the doped wells of the pixels of a same row are common. The bias voltages of the wells are controllable by row to be able to be different from one row to the other. Thus, transistors RSTi, SFi, and RSi receive, at the level of their substrate terminal, a bias voltage V-NWELLi−1 of well NWELLi−1. According to an alternative embodiment, each transistor RSTi, SFi, RSi may be formed in a different N-type doped well biased with different bias voltages, common per row, for transistors of same nature.

Figure 3:
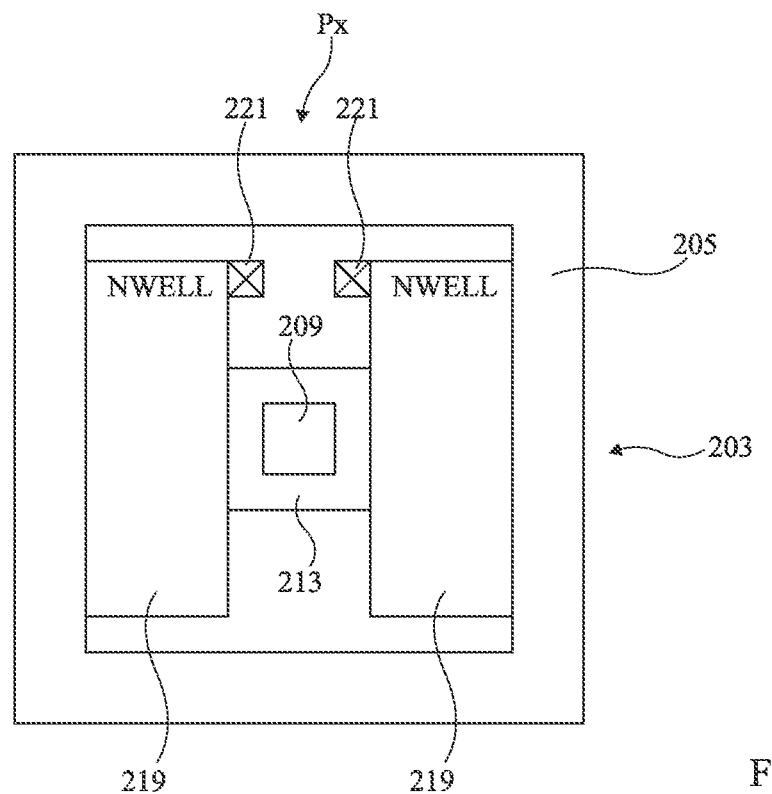
FIG. 3 schematically shows a top view of a pixel of the type of a pixel of the image sensor of FIG. 1.

FIGS. 2 and 3 are partial simplified respective cross-section and top views of a structure of a pixel Px of a pixel array of an image sensor of the type of the pixels described in relation with FIG. 1.

FIGS. 2 and 3 are very simplified and do not show all the layers or areas of pixel Px, but only certain areas to highlight the possibility of biasing the N wells of the transistors of the readout circuit independently from the photosite. The structure of a semiconductor pixel is usual per se.

The pixel array is formed from a P-type doped semiconductor substrate 201. Each pixel Px is formed in a portion 203 of substrate 201 electrically insulated, by insulating trenches 205, from other portions 203 where other pixels Px are formed. Portions 203 are, in top view (FIG. 3), substantially square. Insulating trenches 205 are, for example, a capacitive deep trench isolation (CDTI) extending across the entire thickness of substrate 201, and totally surrounding each portion 203.

As described in relation with FIG. 1, each pixel Pix comprises a photodiode (PD) 207, typically a PN junction visible in the cross-section view of FIG. 2. Photodetector 207 is formed in depth in the portion 203 of substrate 201 or, in other words, photodetector 207 is buried in portion 203. Transfer transistor 209 is formed above photodetector 207. Transistor 209 is very schematically shown in FIG. 2. For example, transfer transistor 209 is a buried gate transistor 213 surrounding an overdoped P-type region 215 (P+) formed from the upper surface 211 of portion 203. N-type doped wells NWELL 219 (N) are formed from the surface 211 of the portion 203 of substrate 201. Wells 219 are configured to accommodate the transistors (not detailed in FIGS. 2 and 3) of the pixel readout circuit, and correspond to the wells NWELLi−1 and NWELLi described in relation with FIG. 1. For example, two wells 219 are formed on either side of transistor 209. Wells 219 are coupled to contacts 221, shown in FIG. 3, enabling to apply a bias voltage thereto. Other contacts and contacting areas are of course present but have not been shown, the structure of a pixel of this type being usual per se.

Figure 4:
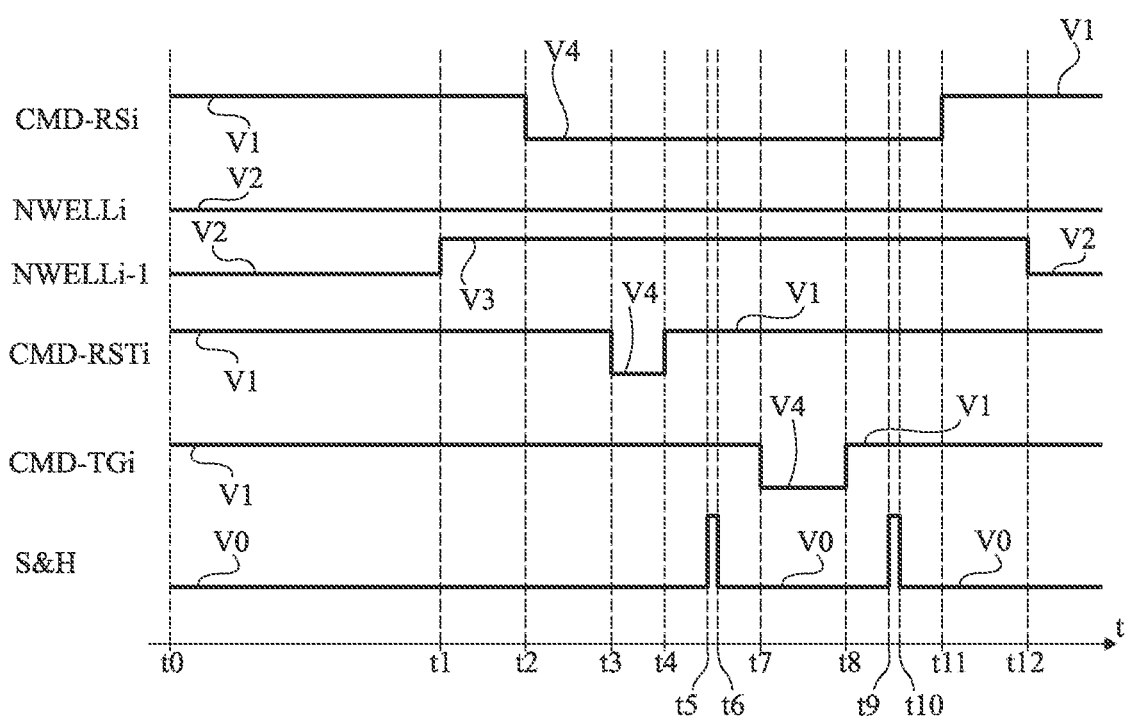
FIG. 4 shows timing diagrams illustrating an implementation mode of a method of reading a pixel of the image sensor of FIG. 1.

FIG. 4 shows timing diagrams of voltages used to implement the reading from the photosite, and more particularly from the photodetector PDi of pixel Pi described in relation with FIG. 1.

FIG. 4 more particularly shows the time variation of the following signals and voltages:
- the row selection signal CMD-RSi applied to the gates of the transistors RSi of row Li;
- the voltage V-NWELLi applied to the substrate portion where the photosite of pixel Pi is formed, that is, the voltage applied to the substrate of photodiode PDi and to transistor TGi;
- the voltage V-NWELLi−1 applied to the wells of the transistors of the readout circuits of row Li, these transistors being arranged in the well NWELLi−1 of pixel Pi−1;
- the control signal CMD_RSTi applied to the gates of the transistors RSTi of row Li, transistor RSTi being formed in the well NWELLi−1 of pixel Pi−1; the row selection signal CMD-TGi applied to the gates of the transistors TGi of row Li; and
- a voltage signal S&H (sample and hold) corresponding to the voltage present on the source of transistor SFi, transistor SFi being formed in the well NWELLi−1 of pixel Pi−1.

It should be noted that it is here considered that the reading from the photodetector PDi−1 of pixel Pi−1 has been performed before an initial time t0, and that from time t0, the reading from the photodetector PDi of pixel Pi is started. Further, it is considered that the photodetector PDi of the pixel has ended its integration phase.

Between initial time t0 and a time t1 subsequent to time t0, photodetector PDi and its control circuit are not used. Thus:
- signal CMD-RSi is at a first high voltage level V1, for example, as an indication, at a voltage in the order of 2.5 V;
- voltage V-NWELLi is at a second high voltage level V2 lower than first high voltage level V1, for example, as an example, as an indication, at a voltage in the order of 2 V;
- voltage V-NWELLi−1 is at the second high voltage level V2;
- signal CMD_RSTi is at the first high voltage level V1;
- signal CMD-TGi is at the first high voltage level V1; and
- voltage signal S&H is at a voltage level V0 defined by a readout circuit associated with the column Cj of pixels Pi−1 and Pi, for example, as an indication, at a voltage in the order of 0 V, or at ground.

At time t1, the use of the control circuit starts, and voltage V-NWELLi−1 is increased up to the first high voltage level V3. In other words, the voltage of well NWELLi−1, where the transistors of the readout circuit of pixel Pi−1 are formed, is increased. The wells of a same row are biased with a same voltage V-NWELLi−1 as will be seen in relation with FIG. 5. The difference between voltages V3 and V2 is in the range from 0.25 to 1 V.

At a time t2, subsequent to time t1, the row of pixel Pi−1 is selected. For this purpose, column selection signal CMD-RSi has switched to the low voltage level V4, for example, as an indication, at a voltage in the order of 0 V.

From a time t3, subsequent to time t2, to a time t4, subsequent to time t3, the voltage at the level of detection node SNi is reset by using transistor RSTi. For this purpose, control signal CMD-RSTi has switched to the low voltage level V4 between times t3 and t4, and is then reset to high voltage level V1.

From a time t5, subsequent to time t4, to a time t6, subsequent to time t5, a first sample of the voltage at the level of detection node SNi is read from the source of transistor SFi. Thus, voltage S&H is at a level corresponding to a reference level, or reset level.

From a time t7, subsequent to time t6, to a time t8, subsequent to time t7, sense node SNi is coupled to the output of photodetector PDi so that the charges accumulated by the photosite of pixel Pi are transferred to sense node SNi by application of a control signal to the gate of transistor TGi, it is the charge transfer phase. For this purpose, control signal CMD-TGi has switched to the low voltage level V4 between times t7 and t8, and then is reset to high voltage level V1.

From a time t9, subsequent to time t8, to a time t10, subsequent to time t9, a second voltage sample at the level of sense node SNi is read from the source of transistor SFi−1, it is the readout phase. Thus, voltage signal S&H is at a voltage level representative of the radiation captured by photodetector PDi during the charge transfer phase. The comparison of the two samples enables to determine the quantity of radiation captured by photodetector PDi.

The reading from photodetector PDi is over, and at a time t11, subsequent to time t10, the column of pixel Pi is deselected. Thus, column selection signal CMD-RSi has switched to the first high voltage level V1. Further, at a time t12, subsequent to time t11, voltage V-NWELLi−1 is decreased to the second high voltage level V2. The process of reading from the photodetector of the next pixel may start.

An advantage of this embodiment is that it enables to protect photodetector PDi from an increase in the bias voltage of the wells having the transistors of the readout circuit formed therein.

Figure 5:
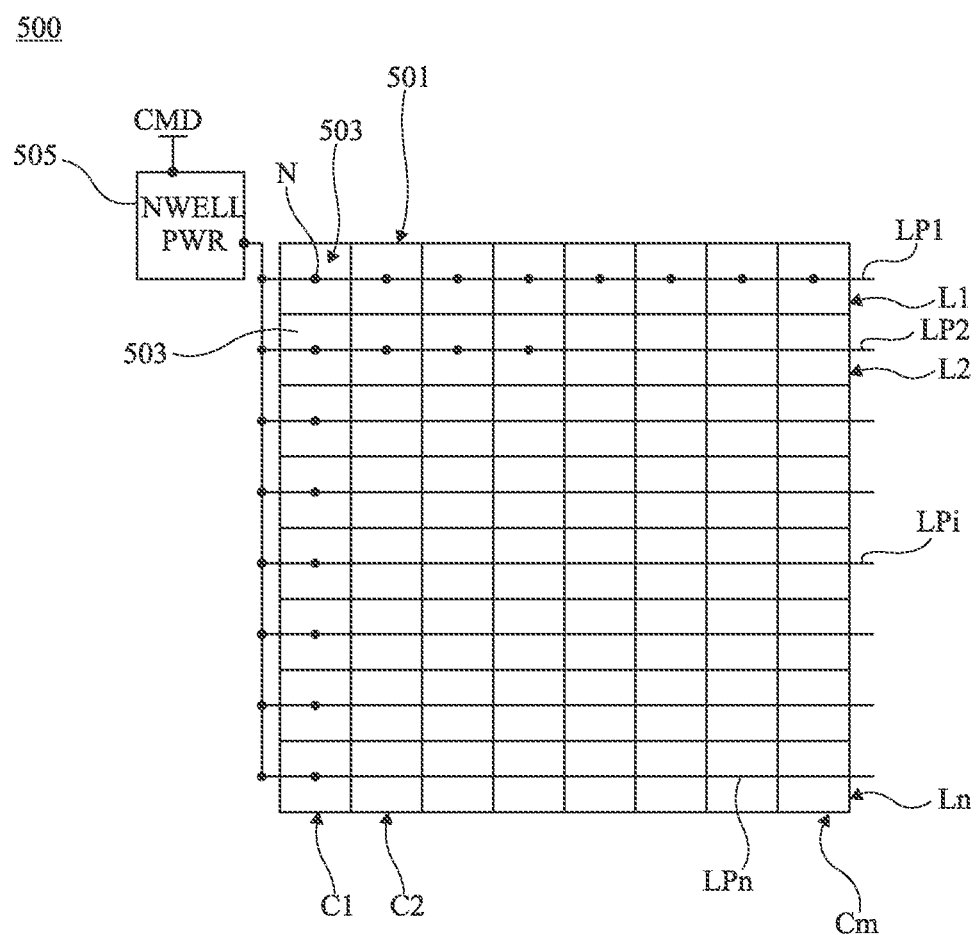
FIG. 5 very schematically illustrates an array layout of an image sensor of the type of that in FIG. 1.

FIG. 5 schematically and partially shows an image sensor 500 of the type of the image sensor comprising the pixels Pi−1 and Pi described in relation with FIG. 1, or the pixel Px described in relation with FIGS. 2 and 3. FIG. 5 more particularly shows a circuit 505 of application of a voltage to the wells of the pixels of the image sensor 500 having the transistors of the readout circuit formed therein.

As previously described, image sensor 500 comprises an array 501 of pixels 503 arranged in n rows L1 to Ln and in m columns C1 to Cm.

As described in relation with FIG. 4, during the reading from a photodetector of a pixel 503, the biasing of the well having the transistors of the readout circuit which is associated therewith formed therein is modified. For this purpose, the wells of the readout circuits of a same row are interconnected and biased by a biasing line LPi. As a reminder, the readout circuit associated with a photodetector of a pixel 503 is a readout circuit comprised in the pixel of the previous row in the same column. The image sensor also comprises row and column selection circuits, not shown in FIG. 5.

Circuit 505 is more particularly configured to bias the wells of pixels 503 of a same pixel row during the implementation of a readout method. Circuit 505, for example, comprises a control input CMD, and at least one output coupled, preferably connected, to the biasing lines of wells LP1 to LPn. Well biasing circuit 505 for example comprises a shift register.

An advantage of the embodiment of an image sensor described herein is that it has a lower power consumption than a conventional image sensor. Indeed, circuit 505 only imposes a higher biasing to the wells of the pixels on a row by row basis and not simultaneously for the entire array.

Figure 6:
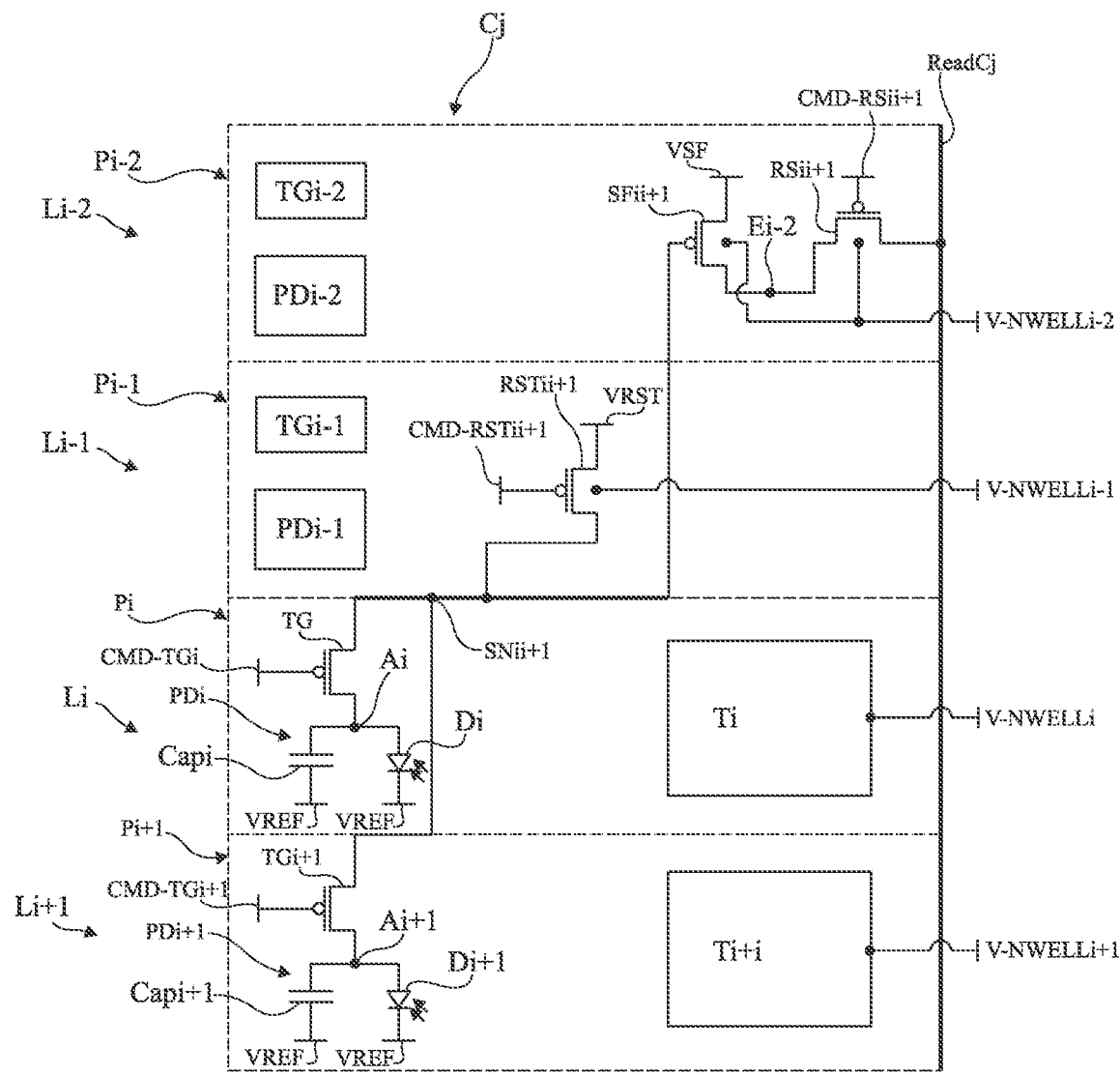
FIG. 6 shows an equivalent electric diagram of four pixels of a same column of another embodiment of an image sensor.

FIG. 6 is an electric diagram of four consecutive pixels Pi−2, Pi−1, Pi, and Pi+1 of a same column Cj of an array of pixels of another embodiment of an image sensor.

The sensor comprises an array layout of identical pixels, organized in rows and in columns. FIG. 6 only shows, for simplification, four pixels Pi−2, Pi−1, Pi, and Pi+1 of respective consecutive rows Li−2, Li−1, Li, and Li+1 of a same column Cj, with i varying from 1 to n, where n represents the number of rows of the array and j varying from 1 to m, where m represents the number of columns of the array.

The image sensor of FIG. 6 comprises pixels having a 2T5-type architecture, that is, a pixel architecture where two photodetectors PDi and PDi+1 arranged on two pixels of two successive rows of a same column have a common readout circuit having its transistors distributed over two different pixels. An advantage of this architecture over the 4T architecture is that the 2T5 architecture is more compact.

In FIG. 6, a single complete 2T5 architecture distributed over four different pixels is shown in detail. The elements of the pixels which do not form part of the detailed 2T5 architecture are represented by blocks and their connections to other elements are not shown to avoid overloading the drawing. The connections and elements which are not specified in the description of FIG. 7 hereafter are identical to those previously described.

Structurally, each pixel Px comprises a photodetector PDx, a transfer transistor TGx, and a readout circuit. The readout circuit comprises, for the rows of even rank, a reset transistor RSTx, and for the rows of odd rank, a readout block formed of a voltage follower transistor SFx and of a selection transistor RSx (where the even and odd character may be inverted). For the rest, each pixel is similar to those described in relation with FIGS. 2 and 3.

In a 2T5 architecture, the photosites are arranged in pairs, the photodetectors PDi and PDi+1 and transfer transistors TGi and TGi+1 of two successive rows of a same column Cj sharing a same sense node SNii+1. Further, these two photosites share a same readout circuit distributed over the pixels Pi−2 and Pi−1 of two rows Li−2 and Li−1 of previous rank of the same column Cj. Transistor RSTii+1, formed in the well NWELLi−1 of pixel Pi−1, is used by the photosites of rank i and i+1 and transistors SFii+1 and RSii+1, formed in the well NWELLi−2 of pixel Pi−2, are used by these same photosites of rank i and i+1. In other words, sense node SNii+1 is coupled, preferably connected, to the source of reset transistor RSTii+1 and to the gate of sense transistor SFii+1. Like for a 4T pixel, the gates of the charge transfer transistors, of the reset transistors, of the selection transistors, and of the sense transistors are interconnected in a row.

Here again, it is provided to interconnect, in a row, the N-type doped wells having the transistors of the pixel readout circuits formed therein. In practice, for each pixel Pi, reset transistor RSTii+1 is formed inside and on top of well NWELLi−1 distinct from well NWELLi−2 having transistors SFii+1 and RSii+1 formed inside and on top of it.

FIG. 7 shows timing diagrams of voltages used to implement the reading from the photodetectors PDi of pixel Pi and PDi+1 of pixel Pi+1 described in relation with FIG. 6.

FIG. 7 more particularly shows the time variation of the following voltages:

the voltage V-NWELLi applied to well the NWELLi having the transistors of the readout block Ti of pixel Pi formed inside and on top of it;

the voltage V-NWELLi+1 applied to the NWELLi+1 having the transistors of the readout block Ti+1 of pixel Pi+1 formed inside and on top of it;

the row selection signal CMD-TGi applied to the gate of the charge transfer transistor TGi of pixel Pi;

the row selection signal CMD-TGi+1 applied to the gate of the charge transfer transistor TGi+1 of pixel Pi+1;

the voltage V-NWELLi−1 applied to well NWELLi−1 having the transistor RSTi−1 of pixel Pi−1 formed inside and on top of it;

the voltage V-NWELLi−2 applied to well NWELLi−2 having the transistors SFi−2 and RSi−2 of the readout block Ti−2 of pixel Pi−2 formed inside and on top of it;

the row selection signal CMD-RSii+1 applied to the gate of the row selection transistor RSii+1 formed inside and on top of the well NWELLi−1 of pixel Pi−2;

the signal CMD_RSTii+1 applied to the gate of the reset transistor RSTii+1 formed inside and on top of the well NWELLi−1 of pixel Pi−1; and the voltage signal S&H corresponding to the voltage present on the source of transistor SFii+1 (sense node SNii+1).

It should be noted that it is here considered that the reading from the photodetectors PDi−1 and PDi−2 of the pixels Pi−1 and Pi−2 has been performed before an initial time t'0, and that from time t'0, the reading from the photodetectors PDi and PDi+1 of pixels Pi and Pi+1 is started. Further, it is considered that the photodetectors PDi and PDi+1 of pixels Pi and Pi+1 have ended their integration phase.

Between initial time t'0 and a time t'1 subsequent to time t'0, photodetectors PDi and PDi+1 and their readout circuit are not used. Thus, the previously-mentioned signals are in their following states:

voltage V-NWELLi is at the voltage level V2 described in relation with FIG. 4;

voltage V-NWELLi+1 is at voltage level V2;

row selection signal CMD-TGi is at the voltage level V1 described in relation with FIG. 4;

row selection signal CMD-TGi+1 is at voltage level V1;

voltage V-NWELLi−1 is at voltage level V2;

voltage V-NWELLi−2 is at voltage level V2;

selection signal CMD-RSii+1 is at voltage level V1;

control signal CMD_RSTii+1 is at voltage level V1; and voltage signal S&H is at low reference voltage level V0.

At time t'1, the use of the readout circuit starts, and voltages V-NWELLi−1 and V-NWELLi−2 are increased up to the first high voltage level V3. In other words, the voltages of the N-type wells having the readout circuit transistors formed therein are increased. According to an alternative embodiment, voltages V-NWELLi−1 and V-NWELLi−2 may be increased up to different high voltage levels V3 and V3'.

At a time t'2, subsequent to time the sense node SNii+1 of the rows of pixels Pi and Pi+1 is selected, for this purpose control voltage CMD-RSii+1 has switched to reference voltage level V4, for example, the ground.

From a time t'3, subsequent to time t'2, to a time t'4, subsequent to time t'3, the voltage at the level of sense node SNii+1 is reset by using the reset transistor RSTii+1 formed in the well NWELLi−1 of pixel Pi−1. For this purpose, control voltage CMD-RSTii+1 has switched to reference voltage level V4 between times t'3 and t'4, and is then reset to voltage level V1.

From a time t'S, subsequent to time t'4, to a time t'6, subsequent to time t'S, a first voltage sample at the level of sense node SNii+1 is read from the source of transistor SFii+1 formed in the well NWELLi-2 of pixel Pi-2. Thus, voltage signal S&H is at a level corresponding to a reference level, or reset level.

From a time t'7, subsequent to time t'6, to a time t'8, subsequent to time t'9, sense node SNii+1 is coupled to the output of photodetector PDi so that the charges accumulated by the photosite of pixel Pi are transferred to sense node SNii+1 by applying a control signal to the gate of the transistor CMD-TGi of photodetector PDi, it is a first charge transfer phase. For this purpose, control signal CMD-TGi has switched to the low voltage level V4 described in relation with FIG. 4, between times t'7 and t'8, and then is reset to high voltage level V1.

From a time t'9, subsequent to time t'8, to a time t'10, subsequent to time t'9, a second voltage sample at the level of sense node SNii+1 is read from the source of transistor SFi-2, it is the first readout phase. Thus, voltage signal S&H is at a voltage level which is a function of the radiation captured by photodetector PDi. The comparison of the two samples enables to determine the quantity of radiation captured by photodetector PDi.

The reading from photodetector PDi is ended, and from a time t'11, subsequent to time t'10, sense node SNii+1 is prepared for the reading from photodetector PDi+1.

From time t'11 to a time t'12, subsequent to time t'11, the voltage at the level of sense node SNii+1 is reset by using, again, reset transistor RSTii+1. For this purpose, control voltage CMD-RSTii+1 has switched to reference voltage level V4 between times t'11 and t'12, and is then reset to voltage level V1.

From a time t'13, subsequent to time t'12, to a time t'14, subsequent to time t'13, a first voltage sample at the level of sense node SNii+1 is read from the source of transistor SFii+1. Thus, voltage signal S&H is at a level corresponding to a reference level.

From a time t'15, subsequent to time t'14, to a time t'16, subsequent to time t'15, sense node SNii+1 is coupled to the output of photodetector PDi+1 so that the charges accumulated by the photosite of pixel Pi+1 are transferred to sense node SNii+1 by applying a control signal to the gate of the transistor CMD-TGi+1 of photodetector PDk+1, it is a second readout phase. For this purpose, control signal CMD-TGi+1 has switched to low voltage level V4, between times t'15 and t'16, and is then reset to voltage level V1.

From a time t'17, subsequent to time t'16, to a time t'18, subsequent to time t'17, a second voltage sample at the level of sense node SNii+1 is read from the source of transistor SFii+1, it is the second readout phase. Thus, voltage signal S&H is at a voltage level which is a function of the radiation captured by photodetector PDi+1. The comparison of the two samples enables to determine the quantity of radiation captured by photodetector PDi+1.

The reading from photodetector PDi+1 is ended, and at a time t'19, subsequent to time t'18, the rows of pixels Pi and Pi+1 are deselected. Thus, column selection signal CMD-RSii+1 has switched to the first high voltage level V1. Further, at a time t'20, subsequent to time t'19, voltages NWELLi-2 and NWELLi-1 are decreased to the second high voltage level V2.

This embodiment has the same advantages as the embodiment described in relation with FIGS. 1 to 5.

Finally, the practical implementation of the described embodiments and variations is within the abilities of those skilled in the art based on the functional indications given hereabove.

The invention claimed is:

1. An image sensor, comprising:
a pixel array including a plurality of pixels;
wherein each pixel in the pixel array is formed in a portion of a substrate electrically insulated from other portions of the substrate;
wherein each pixel comprises: a photodetector; a transfer transistor; and a readout circuit comprising one or more transistors;
wherein the one or more transistors of the readout circuit are formed inside and on top of at least one well of said portion;
wherein at least one transistor of the readout circuit of a pixel of at least one previous row is configured for reading from the photodetector of a pixel of a current row;
wherein the well of the pixel of the at least one previous row is biased at a first bias voltage; and
wherein the well of the pixel of the current row is biased at a second bias voltage, the first bias voltage being greater than the second bias voltage.

2. The sensor according to claim 1, wherein a difference between said first and second bias voltages is in a range from 0.25 to 1 V.

3. The sensor according to claim 1, wherein reading from the photodetector of the pixel of the at least one previous row is performed before reading from the photodetector of the pixel of the current row.

4. The sensor according to claim 1, wherein the image sensor comprises a first circuit configured to bias the wells of the pixels of the array on a row by row basis.

5. The sensor according to claim 4, wherein the first circuit comprises a shift register.

6. The sensor according to claim 1, wherein said one or more transistors of the readout circuit are P-channel MOS transistors.

7. The sensor according to claim 6, wherein the substrate is P-type doped and the well is N-type doped.

8. The sensor according to claim 1, wherein reading from the photodetector of a pixel of a row of rank i uses at least one first transistor of the readout circuit of a pixel of a row of rank i-1 and at least one second transistor of the readout circuit of a pixel of a row of rank i-2, and wherein the well of the pixel of the row of rank i-2 is biased with a third bias voltage greater than the second bias voltage of the well of the pixel of the row of rank i.

9. The sensor according to claim 8, wherein the readout circuit of the pixel comprises a reset transistor, a sense transistor, and a selection transistor; and
wherein said first transistor is the reset transistor, and said at least one second transistor comprises one of: the sense transistor assembled as a source follower and the selection transistor.

10. The sensor according to claim 8, wherein the third voltage is equal to the first voltage.

11. The sensor according to claim 1, wherein the readout circuit of a pixel comprises a reset transistor, a sense transistor, and a selection transistor.

12. An image sensor, comprising:
a pixel array having rows and columns;
a pixel circuit at an intersection of each row and column;
wherein each pixel circuit comprises:
a photodetector with a transfer transistor coupled to the photodetector and having a sense node; and
a readout circuit with an input node coupled to a source-follower transistor, and a read transistor coupled to the source-follower transistor and having an output node, wherein the source-follower transistor and the read transistor of the readout circuit are formed in a semiconductor well;

a read line for each column that is coupled to the output nodes of the readout circuits for the pixel circuits of that column; and wherein a signal at the sense node of the pixel circuit in a current row and current column is applied to the input node of the pixel circuit in a previous row and current column.

13. The image sensor of claim 12, further comprising a biasing circuit configured, during a pixel read operation, to apply a first bias voltage to the semiconductor well of the at least one previous row and apply a second bias voltage to the semiconductor well of the current row, wherein the first bias voltage is greater than the second bias voltage.

14. The sensor according to claim 13, wherein a difference between said first and second bias voltages is in a range from 0.25 to 1 V.

15. The sensor according to claim 13, wherein the biasing circuit comprises a shift register configured to selectively apply the first and second biasing voltages on a row by row basis to the pixel array during the pixel read operation.

16. The sensor according to claim 12, wherein the current row and the previous row are immediately adjacent rows of the pixel array.

* * * * *